(12) United States Patent
Mijatovic et al.

(10) Patent No.: US 11,186,304 B2
(45) Date of Patent: Nov. 30, 2021

(54) METHOD AND ELECTRONIC SYSTEM FOR DETECTING RAIL SWITCH DEGRADATION AND FAILURES

(71) Applicants: ALSTOM TRANSPORT TECHNOLOGIES, Saint-Ouen (FR); FLORIDA INSTITUTE OF TECHNOLOGY, Melbourne, FL (US)

(72) Inventors: Nenad Mijatovic, Melbourne, FL (US); Adrian Manoj Peter, Rockledge, FL (US); Kaylen Jamal Bryan, Winder, GA (US); Charlie Jinshaw Tian, San Jose, CA (US); Christina Mariah Coley, Louisburg, NC (US)

(73) Assignees: ALSTOM TRANSPORT TECHNOLOGIES, Saint-Ouen (FR); FLORIDA INSTITUTE OF TECHNOLOGY, Melbourne, FL (US)

( * ) Notice: Subject to any disclaimer, the term of this patent is extended or adjusted under 35 U.S.C. 154(b) by 562 days.

(21) Appl. No.: 16/027,630

(22) Filed: Jul. 5, 2018

(65) Prior Publication Data
US 2020/0011015 A1    Jan. 9, 2020

(51) Int. Cl.
| | |
|---|---|
| *G01R 31/34* | (2020.01) |
| *B61L 27/00* | (2006.01) |
| *E01B 7/00* | (2006.01) |
| *E01B 35/00* | (2006.01) |
| *B61L 5/10* | (2006.01) |
| *G01R 31/367* | (2019.01) |
| *G01R 31/28* | (2006.01) |
| *B61L 23/04* | (2006.01) |

(52) U.S. Cl.
CPC .......... *B61L 27/0088* (2013.01); *B61L 5/102* (2013.01); *B61L 23/04* (2013.01); *E01B 7/00* (2013.01); *E01B 35/00* (2013.01); *G01R 31/2846* (2013.01); *G01R 31/343* (2013.01); *G01R 31/367* (2019.01)

(58) Field of Classification Search
CPC . E01B 7/20; E01B 35/00; B61L 5/102; B61L 23/04; B61L 27/0088; G01R 31/343; G01R 31/2846; G01R 31/367
USPC ............................................. 324/415, 765.01
See application file for complete search history.

(56) References Cited

U.S. PATENT DOCUMENTS

| | | | | |
|---|---|---|---|---|
| 2002/0186039 | A1* | 12/2002 | Devaney | G01M 13/045 324/765.01 |
| 2004/0199480 | A1* | 10/2004 | Unsworth | F04D 15/0077 706/16 |

(Continued)

*Primary Examiner* — Zachary L Kuhfuss
(74) *Attorney, Agent, or Firm* — Troutman Pepper Hamilton Sanders LLP

(57) ABSTRACT

Method for detecting rail switches degradation and failures, the method having the steps of applying a Discrete Wavelet Transform to stored measurement data relative to a switch move to be analysed and obtaining a feature vector associated with said switch move and including Discrete Wavelet Transform coefficients delivered by the applied Discrete Wavelet Transform; comparing the obtained feature vector with feature vectors associated with rail switch moves previously obtained and associating each to a respective health class among several given health classes; and determining a health class for the said switch move to be analyzed by selecting one of the health classes associated with the previously obtained feature vectors based upon the comparison step.

10 Claims, 2 Drawing Sheets

(56) References Cited

U.S. PATENT DOCUMENTS

2010/0169030 A1* 7/2010 Parlos .................. G01H 1/00
  702/58
2014/0312181 A1* 10/2014 Duan .................. B61L 23/04
  246/415 R

* cited by examiner

METHOD AND ELECTRONIC SYSTEM FOR DETECTING RAIL SWITCH DEGRADATION AND FAILURES

FEDERALLY SPONSORED RESEARCH

This invention was made with government support under 1263011 and 1560345 awarded by the National Science Foundation. The government has certain rights in the invention.

FIELD OF THE INVENTION

The present invention concerns a method for detecting rail switch degradations and failures.

BACKGROUND

As is known, a railroad switch is a mechanical installation enabling railway trains to be guided from one track to another. The switch includes a pair of linked tapering rails, known as points (switch rails or point blades), lying between the diverging outer rails (the stock rails). These points can be moved laterally into one of two positions to direct a train coming from the point blades toward a straight path or a diverging path. The points (switch rails or point blades) are the movable rails which guide the wheels towards either a straight or a diverging track.

The proper functioning of railroad switch machines is vital to maintaining a healthy and route-prioritized railroad network. A switch's reliable operations impact a variety of rail operations, including routing, collision avoidance, and track maintenance. As a critical infrastructure component, there is therefore a need for automated methods and systems for detecting switch degradations and failures, that are able to perform around-the-clock monitoring of a switch's health status, and provide robust and early detection of switch degradations and failures.

SUMMARY

This and other objectives are achieved by a method for detecting rail switch degradations and failures, the method comprising the following steps:
  step (i): collecting and storing, in a database, rail switch measurement data measured during rail switch moves that are to be analyzed;
  step (ii): applying a Discrete Wavelet Transform on the stored measurement data relative to one of the switch moves to be analyzed and obtaining a feature vector associated with said switch move and including Discrete Wavelet Transform coefficients delivered by the applied Discrete Wavelet Transform;
  comparing the obtained feature vector with feature vectors associated with rail switch moves previously obtained by steps (i) and (ii) and associating each with a respective health class among several given health classes;
  determining an health class for the said switch move to be analyzed by selecting one of the health classes associated with the previously obtained feature vectors based on the comparison step.

In embodiments of the invention, the method for detecting rail switch degradations and failures includes one or more of the following features, considered alone or according to all technically possible combinations:

the method for detecting rail switches degradation and failures further comprises a step of triggering a maintenance action relative to the rail switch having performed said switch move, depending on the determined health class;

the comparison and health determination steps includes the following steps:
  determining the Euclidean distances between the obtained feature vector and the previously obtained feature vectors associated with each respective health class;
  comparing the Euclidean distances between the obtained feature vector and the previously obtained feature vectors;
  determining the k smallest Euclidean distances;
  selecting the health class for the said switch move to be analyzed as one of the health classes mostly associated with the previously obtained feature vectors corresponding to the determined k smallest Euclidean distances;

the measurement data relative to a switch move comprises samples and step (ii) further comprising the following steps of normalizing the measurement data relative to a switch move:
  calculating the mean of the samples of the measurement data relative to the switch move and subtracting the calculated mean of each sample relative to the switch move; and
  calculating the standard deviation of the samples of the measurement data relative to the switch move and dividing each sample relative to the switch move by the standard deviation;
  and the Discrete Wavelet Transform is then applied to the normalized measurement data;

the step (ii) further comprises performing time filtering of the measurement data relative to a move based on a sliding window of duration $T_w$ and the Discrete Wavelet Transform is applied—to the measurement data relative to a move time filtered by the sliding window.

The invention also relates to an electronic system for detecting rail switches degradation and failures, the system comprising:
  a data acquisition unit configured for collecting and storing, in a database, rail switch measurement data measured during the rail switch moves to be analyzed;
  a first module configured for applying a Discrete Wavelet Transform to the stored measurement data relative to one of the switch moves to be analyzed and for obtaining a feature vector associated to said switch move and including Discrete Wavelet Transform coefficients delivered by the applied Discrete Wavelet Transform;
  a second module configured for comparing the obtained feature vector with feature vectors associated to rail switch moves and previously obtained by the first module and associating each to a respective health class among several given health classes; wherein the second module is configured for determining an health class for the said switch move to be analyzed by selecting one of the health classes associated with the previously obtained feature vectors based upon the said comparison.

Preferred embodiments of the electronic system are the subject matter described further below, whose content is to be understood as forming an integral part of the present description.

BRIEF DESCRIPTION OF THE DRAWINGS

Further characteristics and advantages of the present invention will become apparent from the following description, provided merely by way of a non-limiting example, with reference to the enclosed drawings, in which.

DETAILED DESCRIPTION

Figure 4:
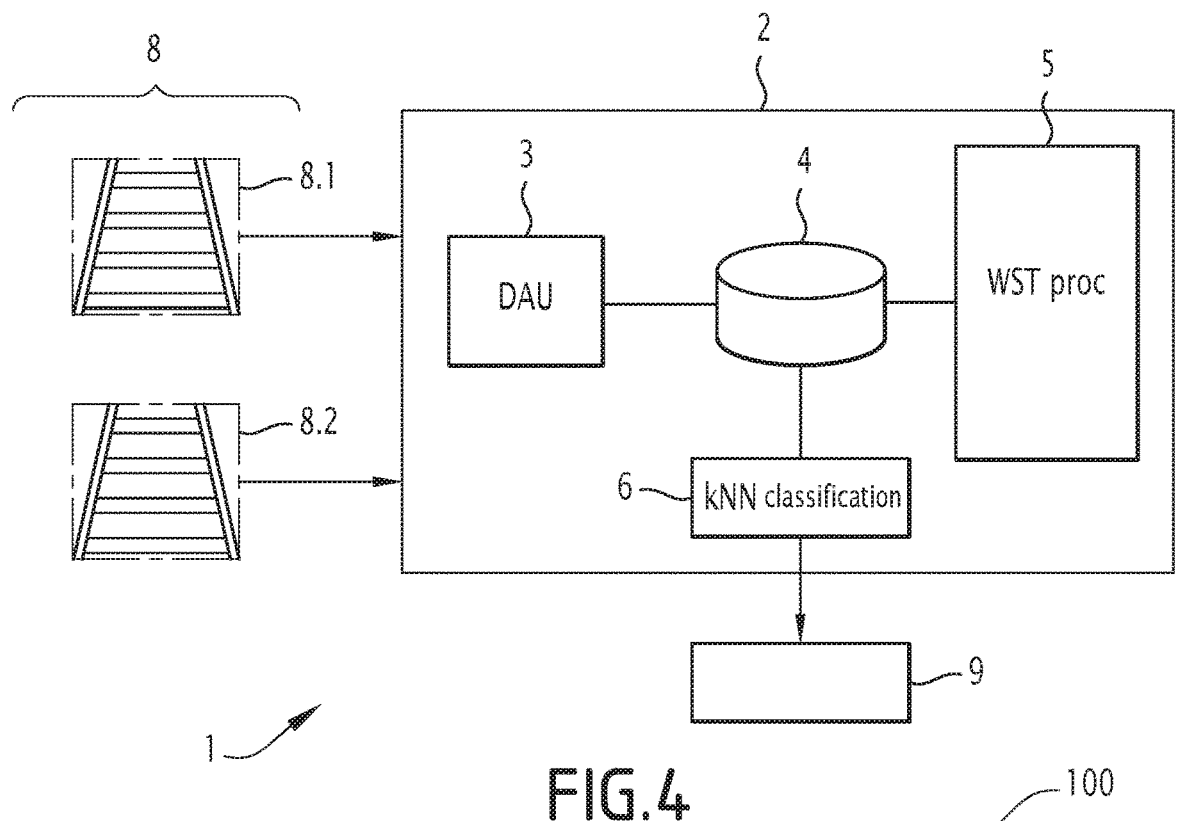
FIG. 4 shows a block scheme of a system for detecting switch degradations and failures according to an embodiment of the present invention.

A block scheme of a railroad platform 1 is shown in FIG. 4. The railroad platform 1 includes railroads comprising numerous rail switches 8 of several types, a railroad signaling module 9 and an electronic system 2 for detecting switch degradations and failures according to an embodiment of the present invention.

The switches 8 includes reference switches 8.1 which are under a controlled and supervised environment to ensure proper data health labelling (such as "healthy", "unhealthy" thus defining two classes, that can be moreover refined in degradation type 1", or "degradation type n−1" in case n health classes are defined).

The switches 8 moreover include switches 8.2, the health classes of which are unknown. The invention provides for a solution to determine if switches 8.2 are healthy or not, during switch moves.

The electronic system 2 for detecting switch degradations and failures includes in the example of FIG. 4 a switch Data Acquisition Unit (DAU) 3, a database 4, an electronic WST (Wavelet Scattering Transform) block 5 and an electronic kNN (k Nearest Neighbor) classification block 6.

The system 2 of FIG. 4 includes for example a processor and a memory; and the WST processor 5 and the electronic kNN classification block 6 are for example respective software stored in the memory and runnable on the processor.

In other embodiments, the WST processor 5 and the electronic kNN classification block 6 each include a programmable logical component such as a FPGA (Field Programmable Gate Array), or a dedicated integrated circuit such as an ASIC (Applications Specific Integrated Circuit).

The DAU 3 is configured to collect defined data representing any switch move processed by the system 2: the DAU thus includes connectors through which the data exchange is performed, such as USB connectors ("Universal Serial Bus"), Ethernet connections, radiofrequency connectors such as Wifi, Bluetooth or modems to connect to the Internet.

The switch data from the reference set of rail switches 8.1 are collected together with respective health labeling (such as "healthy", "unhealthy").

Each switch machine move can be presented using different defined data collected during the switch turnout period, T: current, voltage, or power data of the switch machine motor can be measured using edge sensor or directly using the DAU 3 which can in some embodiments includes several type of sensors for measuring such current, voltage and power data. The data relative to a switch move and captured during a turnout period T are in addition uniformly sampled (with minimal resolution of 1 ms) and ordered in the form of a time series data set. Depending on the embodiments and the type of switches, the sampling and ordering operations are performed in the switches or in the DAU 3, which in this case includes an analogue-to-digital converter and a processor.

The WST block 5 is configured to pre-process each collected reference time series of any switch move by:
calculating the mean, using $$\mu = \frac{1}{n}\sum_i x_i,$$

of the collected reference time series, $x_i$ i=1, . . . , n, of a considered switch move;
calculating the standard deviation, using $$\sigma = \sqrt{\frac{\sum_i (x_i - \mu)^2}{n-1}},$$

of the collected reference time series, $x_i$ i=1, . . . , n, of a considered switch move; and
normalizing by subtracting the mean from each time-series sample $x_i$ of the collected reference time series and dividing with the calculated standard deviation.

The WST block 5 is configured to operate a Wavelet Scattering Transform (WST) upon the pre-processed collected time series data relative to any switch move, as detailed hereafter.

Figure 1:
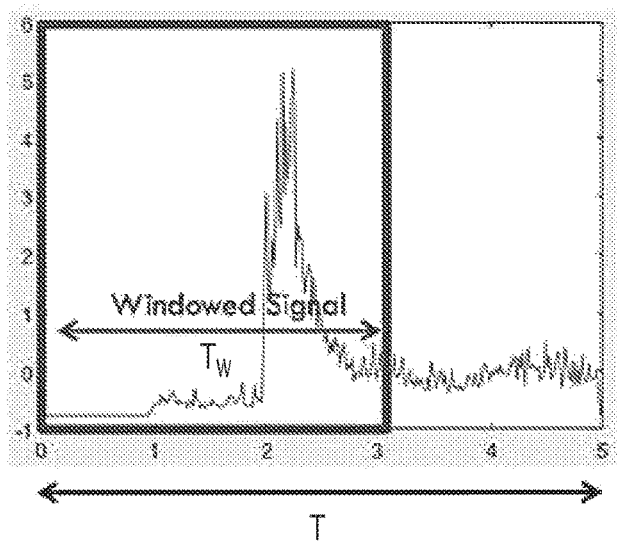
FIG. 1 shows an example of an original switch time-series signal collected during switch turnout time T.

The WST block 5 is thus configured to firstly perform time filtering of any pre-processed collected time series data relative to a move, based on a sliding window of duration $T_w$, as illustrated in FIG. 1.

Then, for each windowed signal, the WST block 5 is configured to perform Discrete Wavelet Transform (DWT).

DWT is a transformation that decomposes the signal to a set of coefficients thus providing new representations of the signal. The coefficients are calculated through convolution with different basis signals, called wavelets.

Figure 2:
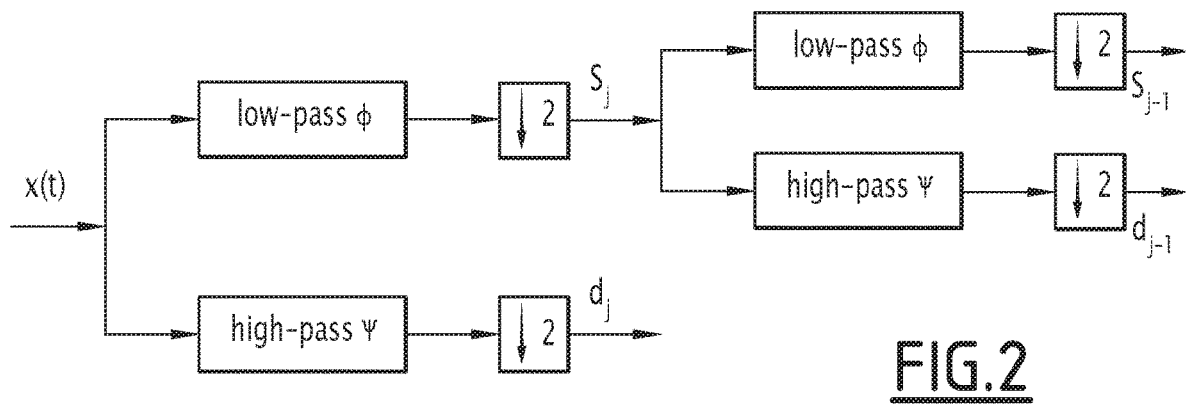
FIG. 2 shows an example of a block scheme of a used bank of low-pass and high-pass filters and down-samplers according to an embodiment of the present invention.

As illustrated in FIG. 2, the signal is convolved with a bank of low-pass and high-pass filters.

When the signal is processed with a low-pass filter, approximation coefficients are obtained. Similarly, when the high-pass filter is used, the signal is presented with detail coefficients.

The output of each low-pass filter is down-sampled by a factor 2, and passed to the next bank of low- and high-pass filters, so that the next set of approximation and detail coefficients can be obtained. The number of filter banks is defined as the wavelet resolution. For a windowed signal x(t) corresponding to one window duration $T_w$, the sub-vector obtained is $(s_j, s_{j-1}, \ldots, s_0, s_j, d_{j-1}, \ldots d_0)$. Finally, this process of calculating coefficients is repeated for a new sliding window, until the whole turnout period T is sampled. The size of the sliding window, WST layers, as well as of the wavelet resolution values can be determined through the cross-validation technique.

As defined, WST takes an original switch time-series data and generates a set of (approximation and detail) coefficients. All coefficients generated for a switch time-series data set with r windowed signals $x_i(t)$ can be observed as a global feature vector: $Vect_F = [Vect_{Fi}]_{i=1 \; \text{à} \; r}$, where $Vect_{Fi} = (s_{i,j}, s_{i,j-1}, \ldots s_{i,0}, d_{i,j}, d_{i,j-1}, \ldots d_{i,0})$.

The WST-transformation of all switch data moves of the reference switches 8.1 by the WST block 5 provides the reference WST-feature vectors. The reference switches, as classified, have a known "health" label (such as "healthy", "unhealthy"). The WST block 5 is configured to store the reference feature vectors in the database 4 each associated with a respective health label.

Once a WST feature vector has been determined by the WST block 5 relative to a new switch move of a switch 8.2, the WST block 5 is configured to store it in the database 4 and to provide it to the kNN classification block 6.

In order to classify this new switch move of a switch 8.2, the k Nearest Neighbor (kNN) algorithm is used by the kNN classification block 6. The kNN classification block 6 is configured to firstly determine the Euclidean distances between this WST feature vector and all labeled WST feature vectors, then to compare the Euclidean distances between its WST feature vector and all labeled WST feature vectors in order to find k smallest distances.

Figure 3:
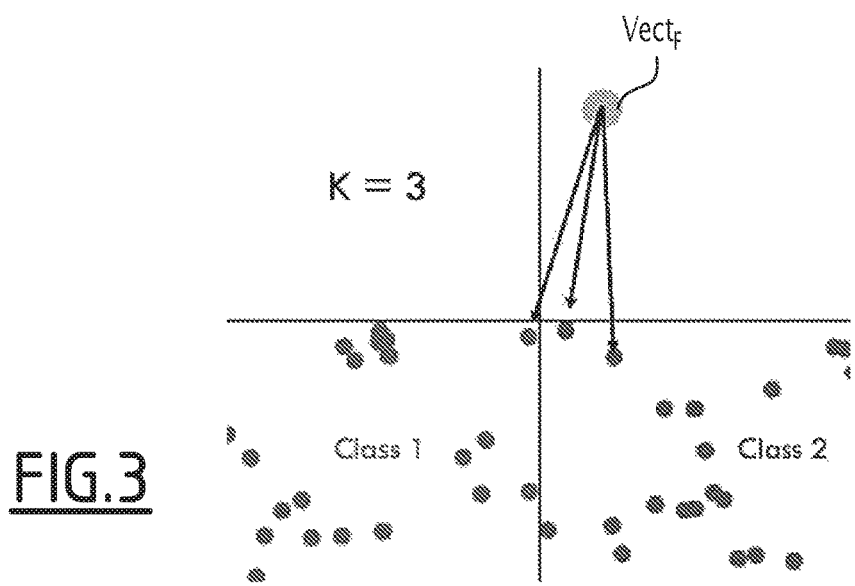
FIG. 3 illustrates the classification of a new feature vector using k=3 nearest neighbors from two classes.

The class label of the new switch move is chosen based on a majority vote (i.e. the class label mostly present among the k nearest labelled WST feature vectors), as illustrated in FIG. 3.

FIG. 3 illustrates a kNN operation performed on the WST feature vectors. This example classifies a new WST feature vector $Vect_F$ using k=3 nearest neighbors from two classes (n=2), reference feature vectors of class 1 ("healthy") being the points at the left of the vertical line whereas the reference vectors of class 2 ("non healthy") being the points at the right of the vertical line. The nearest 3 neighbors as shown by arrows include one class 1 vector and two class 2 vectors: therefore $Vect_F$ is classified as belonging to Class 2.

In an example of used switch machine type, the signal captured for a switch move contains 1001 time samples. In order to apply the WST, the signals are in addition padded with zeros until they reached the next power of 2 (in this case $2^{10}=1024$, so 23 zeros are added to the original signal).

For the provided switch machine type, the best classification results are obtained using the "Symlets 4" wavelet family, the window size of $2^4=16$ samples, the wavelet levels set to 3 (starting resolution level) with resolution wavelet resolutions of 4, 3, 3 [4, 3, 3 specifies the final resolution level used for the 3 sliding windows in this embodiment: for example for the $3^{rd}$ window, the highest wavelet resolution was 3]; the final feature vectors were of length 1792.

Figure 5:
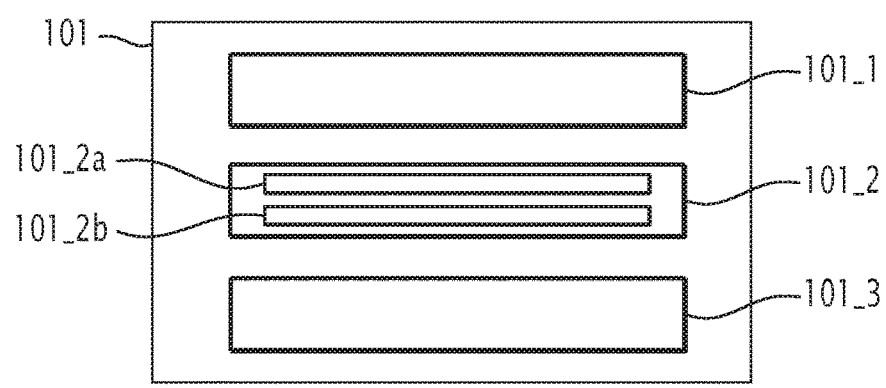
FIG. 5 shows steps of a method for detecting switch degradations and failures according to an embodiment of the present invention.
Figure 5:
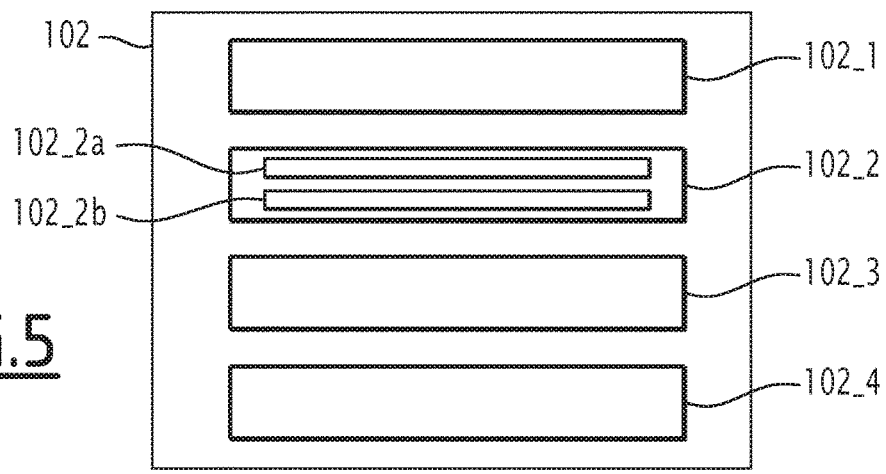

The steps performed according to a method for detecting rail switch degradations and failures in an embodiment of the invention are illustrated in FIG. 5.

First, in step 101 determination of a labelled set of feature vectors, the steps 101_1, 101_2 and 101_3 are carried out, for example in a system such as system 2.

In step 101_1, the switch machine measurements from the reference set of rail switches 8.1 are collected through DAU 3, together with respective appropriate data labeling such as "healthy", "non healthy", or more specifically as "degradation type 1", . . . "degradation type n–1", thus defining n classes.

The labelled switch machine data corresponding to each switch move of the reference set of rail switches 8.1 is stored in the common database 4, including the original data, presented as a time series, as well as the associated appropriate label.

Then in step 101_2 of WST Transformation:
in step 101_2a of data pre-processing, all these reference time series are pre-processed by removing, i.e. subtracting, the mean and then normalized by the standard deviation for each switch machine time series;

in step 101_2b of WST coefficient calculation, the WST coefficients are calculated using the normalized data resulting from step 101_2a, by performing time filtering of any pre-processed collected time series data relative to a move by a sliding window of duration $T_w$, then by performing Discrete Wavelet Transform as explained in detail above.

In step 101_3, the coefficients calculated for each time series, corresponding to each switch move thus define a respective reference feature vector and are stored in the database with the associated label.

This concludes labelled data collection and labelled WST feature vector extraction.

In order to classify a new switch move as "healthy", degradation type 1", "degradation type n–1", the following steps are performed.

Applicable switch data from any switch machine 8.2 in service is collected using the DAU 3, in step 102_1.

Then in step 102_2 of WST Transformation:
this collected switch data are further pre-processed and normalized in step 102_2a (as in step 101_2a), and
in step 102_2b, as in previous step 101_2b, the associated WST coefficients are calculated using the normalized data issued from step 102_2a thus defining the feature vector associated to the new switch move, and stored in the database.

In step 102_3 of classification, finally, the kNN algorithm is used to classify the new switch move comprising:
firstly determining the Euclidean distances between this WST feature vector associated to the new switch move and all labeled WST feature vectors; then
comparing the Euclidean distances between its WST feature vector and all labeled WST feature vectors in order to find k smallest distances;
choosing the class label of the new switch move as the class label mostly present among the k nearest labelled WST feature vectors.

In step 102_4, if a degraded state is reported by the kNN algorithm, an alarm will be transmitted by the system 2 to the rail road signaling module 9 in the rail road signaling department and the appropriate maintenance action will be triggered, for example automatically determined by the system 2 depending on the reported degraded state. For example, based on the degradation type, the appropriate maintenance crew will be sent to the field to fix the issue.

In certain configurations, WST feature extraction can be avoided, and the new switch data can be classified using the kNN algorithm only. This is not the desired application, but it can be used as a baseline for WST accompanied with a kNN approach.

Hence the invention presents a novel solution for classifying various switch degradation levels and types using the related measurements associated with switch machine transitions. Two different machine learning techniques that do not require any algorithm training nor any expert feature extraction are used in the embodiments described herein: (1) Wavelet Scattering Transform (WST) and (2) k Nearest Neighbors (kNN) algorithms. WST can extract robust features from the original switch machine measurements that are locally time invariant and stable to time-warping deformations. kNN is used to perform classification on the extracted features after WST is completed or as a stand-alone classification algorithm.

Depending on the types and number of classes, the invention enables the revelation and distinction of normal signal behaviors from defective ones, and can also distinguish between distinct degradation and failure types and thus provides for a classification of the defective switches.

Based on such a classification of the switch defect, proper action can thus be triggered, for example automatically scheduling of the relevant maintenance task, the ordering of the relevant maintenance piece, etc.

The invention claimed is:

1. Method for detecting rail switches degradation and failures, the method comprising the following steps:
   step (i): collecting and storing, in a database, rail switch measurement data measured during the rail switch moves to be analyzed;
   step (ii): applying a Discrete Wavelet Transform on the stored measurement data relative to one of the switch moves to be analyzed and obtaining a feature vector associated with said switch move and including Discrete Wavelet Transform coefficients delivered by the applied Discrete Wavelet Transform;
   comparing the obtained feature vector with each of a plurality of feature vectors associated to rail switch moves previously obtained by steps (i) and (ii) and associating each to a respective health class among n given health classes, n being greater than or equal to 2;
   selecting k previously obtained feature vectors among the plurality of previously obtained feature vectors based upon the comparison step and,
   determining a health class for the said switch move to be analyzed by selecting, based on a majority vote, one of the health classes associated with k selected feature vectors, k being greater than n.

2. Method for detecting rail switches degradation and failures according to claim 1, further comprising a step of triggering a maintenance action relative to the rail switch having performed said switch move, depending on the determined health class.

3. Method for detecting rail switches degradation and failures according to claim 1, wherein the comparison and health determination steps includes the following steps:
   determining the Euclidean distances between the obtained feature vector and the previously obtained feature vectors associated with a respective health class;
   comparing the Euclidean distances between the obtained feature vector and the previously obtained feature vectors;
   determining the k smallest Euclidean distances;
   selecting the health class for the said switch move to be analyzed as one of the health classes most associated with the previously obtained feature vectors corresponding to the determined k smallest Euclidean distances.

4. Method for detecting rail switches degradation and failures according to claim 1, wherein the measurement data relative to a switch move comprises samples and the step (ii) further comprising the following steps of normalizing the measurement data relative to a switch move:
   calculating the mean of the samples of the measurement data relative to the switch move and subtracting the calculated mean of each sample relative to the switch move; and
   calculating the standard deviation of the samples of the measurement data relative to the switch move and dividing each sample relative to the switch move with the standard deviation; and the Discrete Wavelet Transform is applied to the normalized measurement data.

5. Method for detecting rail switches degradation and failures according to claim 1, wherein the step (ii) further comprises:
   performing time filtering of the measurement data relative to the switch move based on a sliding window of duration $T_w$,
   wherein the Discrete Wavelet Transform is applied to the measurement data relative to a move time filtered by the sliding window.

6. Electronic system for detecting rail switches degradation and failures, the system comprising:
   a data acquisition unit configured for collecting and storing, in a database, rail switch measurement data measured during rail switch moves to be analysed;
   a first module configured for applying a Discrete Wavelet Transform to the stored measurement data relative to one of the switch moves to be analysed and for obtaining a feature vector associated to said switch move and including Discrete Wavelet Transform coefficients delivered by the applied Discrete Wavelet Transform;
   a second module configured for comparing the obtained feature vector with each of a plurality of feature vectors associated to rail switch moves previously obtained by the first module and associating each to a respective health class among n given health classes; wherein the second module is configured for selecting k previously obtained feature vectors among the plurality of previously obtained feature vectors based upon the said comparison and determining a health class for the said switch move to be analyzed by selecting, based on a majority vote, one of the health classes associated with k selected feature vectors; wherein n is greater than or equal to 2 and k is greater than n.

7. The electronic system for detecting rail switches degradation and failures according to claim 6, configured for triggering a maintenance action relative to the rail switch having performed said switch move, depending on the determined health class.

8. The electronic system for detecting rail switches degradation and failures according to claim 6, wherein the second module is configured for determining the Euclidean distances between the obtained feature vector and the previously obtained feature vectors associated with each respective health class; for comparing the Euclidean distances between the obtained feature vector and the previously obtained feature vectors; for determining the k smallest Euclidean distances; and for selecting the health class for the said switch move to be analyzed as one of the health classes mostly associated to the previously obtained feature vectors corresponding to the determined k smallest Euclidean distances.

9. The electronic system for detecting rail switches degradation and failures according to claim 6, wherein the measurement data relative to a switch move comprises samples and the first module is configured for normalizing the measurement data relative to a switch move by calculating the mean of the samples of the measurement data relative to the switch move and by subtracting the calculated mean of each sample relative to the switch move; and by calculating the standard deviation of the samples of the measurement data relative to the switch move and by dividing each sample relative to the switch move with the standard deviation;
   wherein the first module is further configured for applying the Discrete Wavelet Transform to the normalized measurement data.

10. The electronic system for detecting rail switches degradation and failures according to claim 6, wherein the first module is further configured for performing time filtering of the measurement data relative to a move based on a sliding window of duration $T_w$ and for applying the Discrete Wavelet Transform to the measurement data relative to a move time filtered by the sliding window.

* * * * *